United States Patent [19]

Palagonia

[11] Patent Number: 5,604,377
[45] Date of Patent: Feb. 18, 1997

[54] SEMICONDUCTOR CHIP HIGH DENSITY PACKAGING

[75] Inventor: Anthony M. Palagonia, Undorhill, Vt.

[73] Assignee: International Business Machines Corp., Armonk, N.Y.

[21] Appl. No.: 541,848

[22] Filed: Oct. 10, 1995

[51] Int. Cl.⁶ ................................... H01L 23/02
[52] U.S. Cl. ........................ 257/685; 257/686; 257/723
[58] Field of Search ................................... 257/685, 686, 257/723, 714

[56] References Cited

U.S. PATENT DOCUMENTS

| | | | |
|---|---|---|---|
| 4,996,587 | 2/1991 | Hinrichsmeyer et al. | 357/74 |
| 5,030,110 | 7/1991 | Groves et al. | 439/69 |
| 5,128,831 | 7/1992 | Fox, III et al. | 361/396 |
| 5,172,303 | 12/1992 | Bernardoni et al. | 361/396 |
| 5,239,199 | 8/1993 | Chiu | 257/723 |
| 5,327,327 | 7/1994 | Frew et al. | 257/686 |
| 5,909,305 | 5/1992 | Dunaway et al. | 357/70 |

FOREIGN PATENT DOCUMENTS

| | | | |
|---|---|---|---|
| 4145650 | 5/1992 | Japan | 257/714 |
| 4-241447 | 8/1992 | Japan | 257/685 |

*Primary Examiner*—William Mintel
*Assistant Examiner*—Roy Potter
*Attorney, Agent, or Firm*—Thornton & Thornton; Eugene Shkurko

[57] ABSTRACT

A packaging scheme for a stack of semiconductor chips that is light weight and has better cooling and mechanical and electrical protection than that hitherto provided for. The stack of semiconductor chips are connected to a wiring interface. Separating each of the chips from any adjacent chip is a supporting, insulating interposer. Each interposer electrically insulates each chip from any adjacent chip while mechanically protecting the chip supported thereby. The interposers are the cantilevered shelves of a rack and they prevent undue mechanical movement of the chips while still permitting for convection cooling of the chips. An hermetically sealed enclosure around the stack of chips, can be provided with a cooling fluid therein and completes the package. In another arrangement, the rack is itself is provided with circuitry which may be coupled to the chips positioned and supported therein.

10 Claims, 4 Drawing Sheets

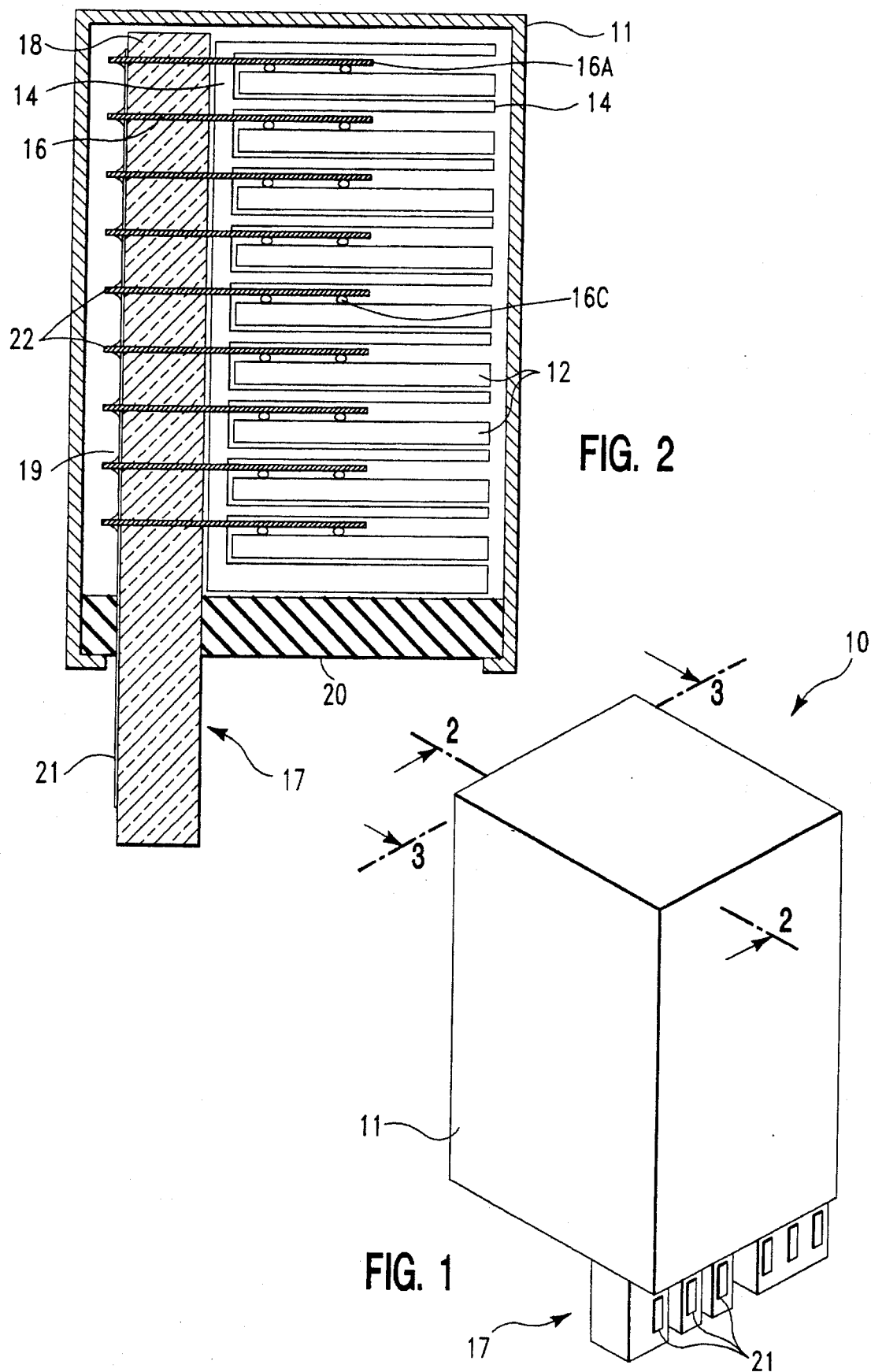

SEMICONDUCTOR CHIP HIGH DENSITY PACKAGING

FIELD OF THE INVENTION

The present invention relates to semiconductor chip packaging and more particularly to a high density, stacked, chip package.

BACKGROUND OF THE INVENTION

In the semiconductor packaging industry, increased density of chip packaging is highly desirable, so long as thermal and conductivity problems are addressed.

The prior art teaches that a package could be formed by rigidly securing semiconductor chips to fixed surfaces, encapsulating them and then stacking the encapsulated chips.

The art also teaches that semiconductor chips can be used in a so-called cube. This cube is formed by stacking the chips such that the back surface of one chip abuts the front surface of an adjacent chip, and then rigidly enclosing the stack of chips in an encapsulation material.

Still further the prior art teaches coating the surface of each chip with an insulating material, mounting the chip vertically with respect to a surface, and affixing heat sinks to each chip over the insulating material and inserting these heat sinks into a cover unit.

The arrangements taught by the above cited prior art all lack mechanical resiliency and have failed due to mechanical shock or vibration. Also, these arrangements generally have poor heat transmission capabilities.

Thus, the industry has been seeking a package for semiconductor devices that is light weight, provides better cooling than that achieved by known prior art structures, is easy to assemble and provides better mechanical shock and vibration protection.

SUMMARY OF THE INVENTION

Broadly, the invention is a packaging scheme for a vertical stack of semiconductor chips that is light weight and has better cooling and mechanical and electrical protection than that presently provided for in the prior art.

The invention is especially directed toward a vertical stack of semiconductor chips, connected via lead frames to a wiring interface, and having an interposer means for mechanically supporting and electrically insulating the stacked chips from one another.

More particularly, the interposer means is in the form of a rack structure, having a series of shelves thereon. The shelves provide for the mechanical support and electrical isolation for the chips inserted therebetween. The shelves of the rack are spaced to prevent undue mechanical movement of the chips while still permitting convection cooling of the chips.

It is therefore a feature of the invention to provide a stack of memory chips with an improved means of heat dissipation and better mechanical vibration and shock protection.

These desirable features, results and other advantages of the present invention are realized and provided in a semiconductor device package comprising, in one arrangement, a base, supporting a printed circuit board, to which a plurality of semiconductor chips are connected. An insulating structure in the form of a rack having extended shelves thereon abuts the printed circuit board. A respective chip is positioned atop one of the shelves and between respective shelves so that the shelves are interposed between respective adjacent chips to restrict the movement of and protect the semiconductor chips positioned therein. An hermetically sealed enclosure around the stack of chips, which can be provided with a cooling fluid, completes the package.

In another arrangement, the rack is itself is provided with circuitry which may be coupled to the chips positioned and supported therein.

These and other features, and advantages of the invention will be apparent from the following more particular description of the preferred embodiment of the invention as illustrated in the accompanying drawings.

BRIEF DESCRIPTION OF THE DRAWINGS

FIG. 1 is an overall view of the present invention.

FIG. 2 is a cross sectional view of the present invention taken along the line 2—2 of FIG. 1.

DESCRIPTION OF THE PREFERRED EMBODIMENT

Figure 4:
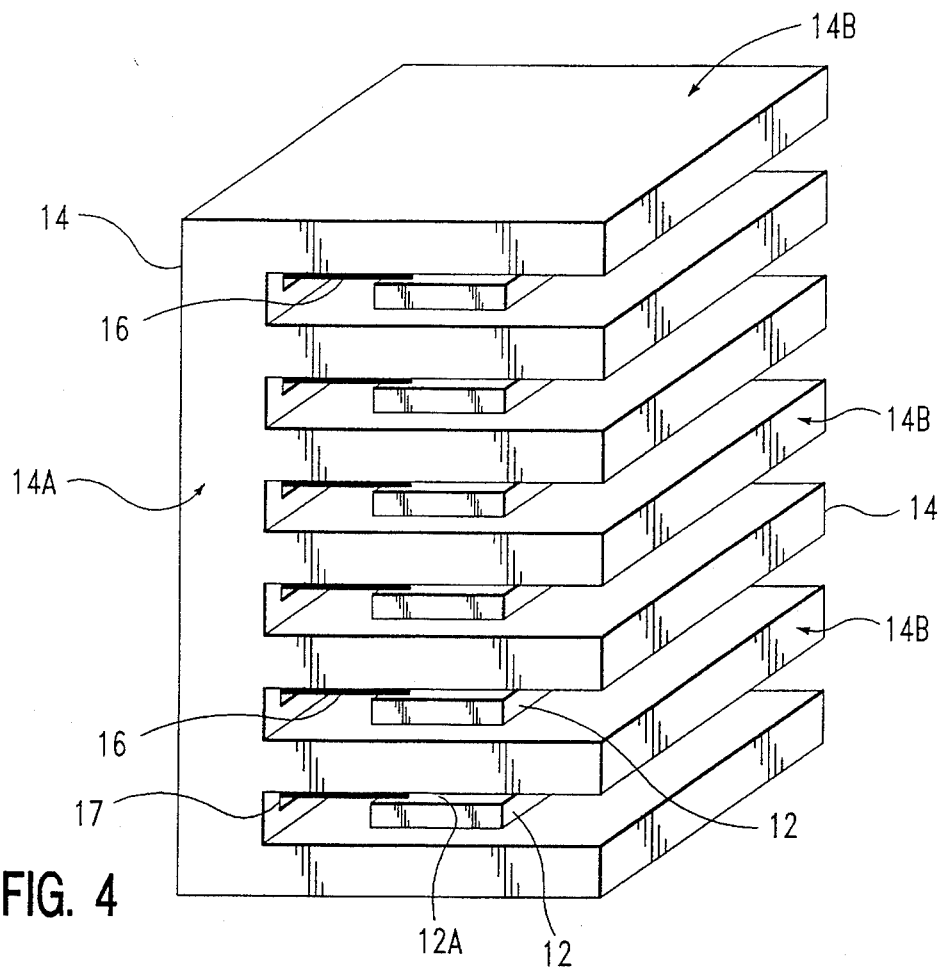
FIG. 4 is an isometric view of one embodiment of the rack of the invention.

With reference now to FIGS. 1, 2, 3, 4, and 5, the present invention will be more fully described. In these Figs. the package 10 is comprised of an enclosure 11, preferably constructed of a light weight, heat conductive material such as aluminum, containing a stack of semiconductor chips 12 insulated and protected by an interposer structure in the form of a rack 14. Each of the chips 12 is connected via respective lead frame fingers 16 to a printed circuit board 18.

As shown in these FIGS. 1 to 5, a portion 17 of the printed circuit board 18 protrudes through the base 20 such that it extends out of the enclosure 11. As is well known to the art the printed circuit board 18 has wiring 19 disposed thereon and has electrical card edge connectors 21 for plugging into a next level of assembly (not shown). Means, other than printed circuit cards, for electrically connecting the chips to the next level of assembly can also be provided and will be further discussed below.

The printed circuit board 18 and the enclosure 11 are both hermetically sealed to the base 20 by techniques well known to the art. The enclosure 11 thus contains a major portion of the printed circuit board 18, the vertical stack of the semiconductor chips 12, the interposer structure or rack 14, and the lead frame fingers 16.

Figure 5:
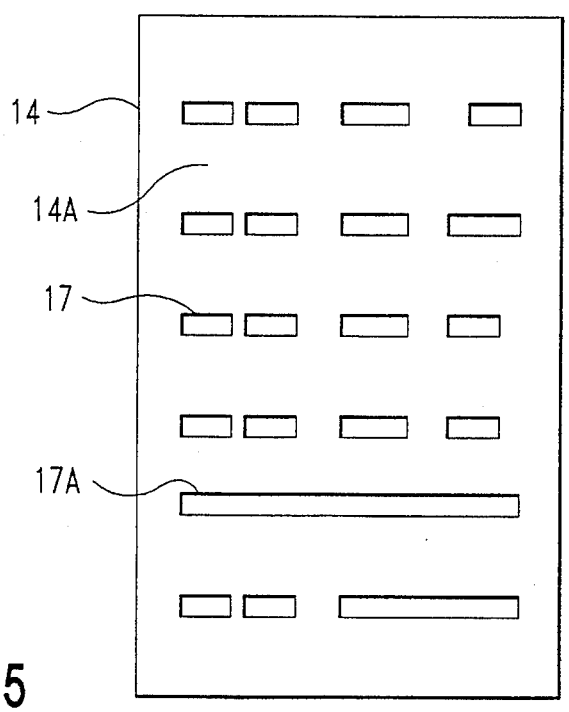
FIG. 5 is a plan view of the back of the rack of FIG. 4.

Turning now to FIGS. 4 and 5, the rack or interposer structure 14, in which the semiconductor chips 12 are disposed, will be described in greater detail.

The rack 14 is preferably formed of an insulating or high dielectric material such as plastic. The rack 14 is comprised of a planar support or back 14A having parallel, major surfaces, a plurality of cantilevered, conterminate, spaced shelves 14B affixed perpendicularly on of its major surfaces and an array of through holes or apertures 17 formed therein. These apertures generally are arranged in rows with each such row of apertures falling between a respective pair of shelves 14B. The spacing of these shelves 14B is preferably just sufficient for a semiconductor chip 12, having lead frame fingers 16 affixed thereto, to be inserted therein.

As is depicted in FIG. 5, the apertures 17 may be of any reasonable shape and size and, as shown, can be of varying size if needed for special lead configurations affixed to the chips. Typically, however the apertures are uniform and have a rectangular cross-section of 0.013 inches by 0.003 inches. Apertures of this size will permit the easy passage of standard, commercially available, lead frame fingers 16 therethrough. It should also be understood that, instead of providing the back 14A, of the rack 14, with individual apertures for each lead frame finger, a single slot 17A could be provided such that all the lead frame fingers could be simultaneously passed therethrough.

As noted above and as shown in FIG. 4 the semiconductor chip 12 has affixed thereto electrodes in the form of lead frame fingers 16. These fingers 16 are formed from a so-called single ended lead frame. Such lead frames are typically formed from a sheet of a metal alloy by either etching or stamping. The stamping or etching process creates a lead frame having a plurality of respective lead fingers 16 interconnected by selvege. The sheet, from which the lead frame is formed, is of a sufficient thickness such that the fingers, once they are released from the selvege, are stiff enough to be self supporting. Such lead frames are widely known, used extensively in the semiconductor industry and readily available in commerce.

Figure 6:
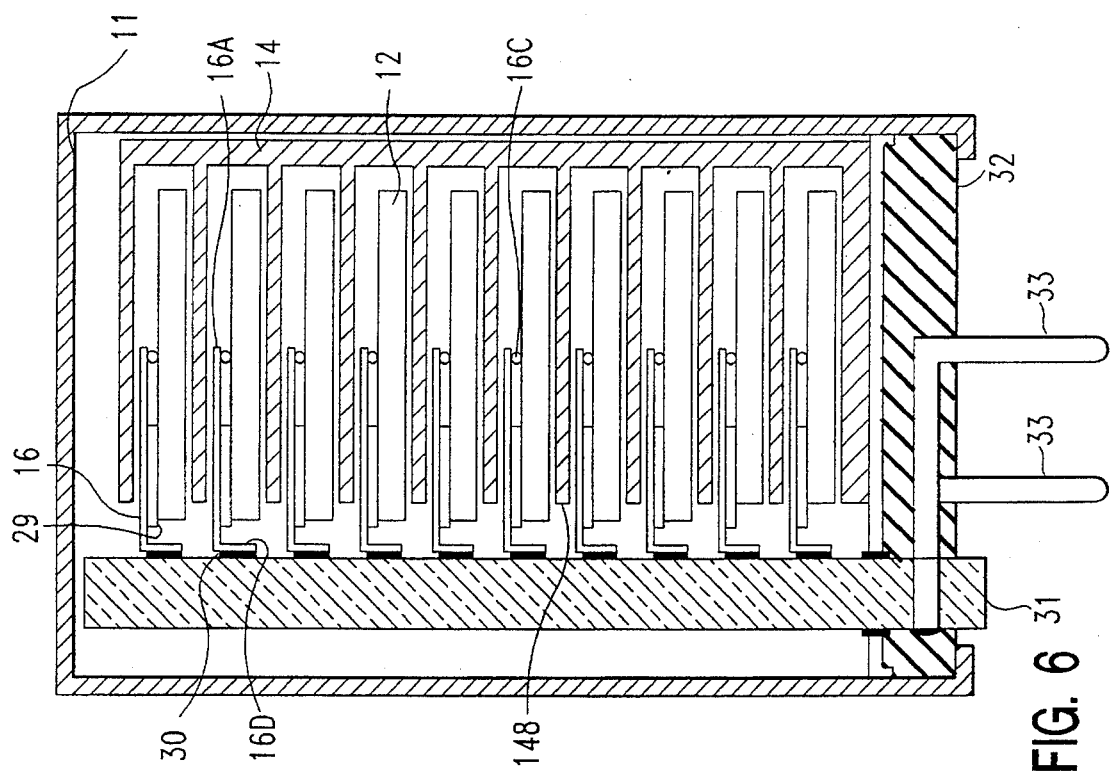
FIG. 6 is a sectional view of another embodiment of the present invention.
Figure 3:
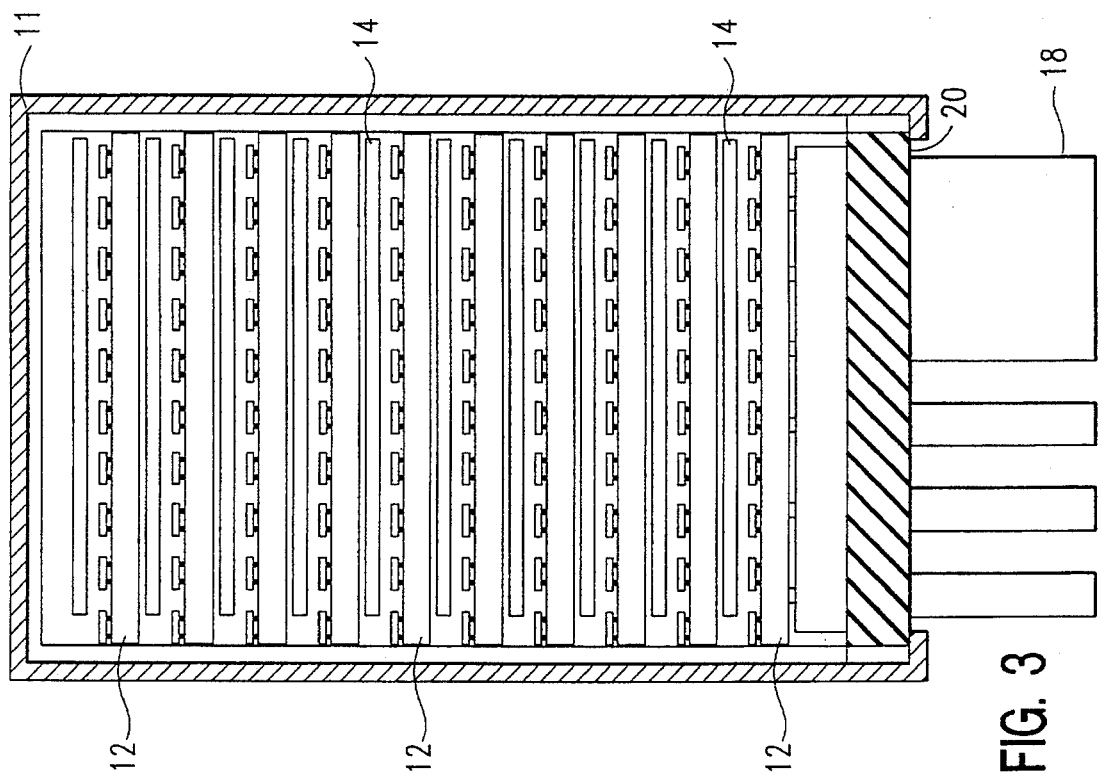
FIG. 3 is a cross sectional view of the present invention taken along the line 3—3 of FIG. 1.

The method of assembly of the present invention is as follows. One end of each finger, i.e., the proximal end 16A of each finger, in a respective lead frame, is affixed to an appropriate Input/Output, ground or power pad on the active face of the chip. The fingers 16 can be affixed to either face of the chip, by solder as shown in FIG. 2 or by an insulating adhesive or tape 29, as shown in FIG. 6, or other methods known to one skilled in the art. The only requirement being that the distal ends 16B of the fingers 16 be canterlevered from the chip 12. Following this step of securing the fingers 16 to the chip 12, the lead frame selvege (not shown) is removed separating the fingers 16 from one another.

Once each chip has a set of respective lead frame fingers 16 mounted thereon, individual fingers 16 are electrically connected to an appropriate Input/Output, ground or power pad on the active face of the chip, i.e., that face of the chip which contain active and passive semiconductor elements. The fingers are electrically connected by, for example, soldering, as shown by solder ball 16C or any other well known method such as wire bonding. This assembly of lead frame and chip can now be tested. The chips passing the test are collected and a rack is selected. A chip, with the lead frame fingers 16 secured there to, passing the test, is then inserted between a respective pair of adjacent shelves 14 until the rack is filled. Thus each pair of shelves has a good chip 12 sited therebetween such that the shelves are interposed between adjacent chips to separate and insulate each chip from any adjacent chips.

In this preferred arrangement the spacing between the shelves 14B is just greater than the height of the semiconductor chip 12 and any attached electrodes, thus allowing the chip to rest on the lower shelf while still permitting convection currents to flow across the active face of the chip 12, while preventing excessive mechanical movement of the chips.

The chips are inserted between the shelves such that the lead frames bonded thereto pass through a respective slot or row of apertures 17 in the back of the rack 14 and then enter into corresponding, respective openings 22 in the printed circuit board 18 where they are bonded, e.g., by soldering, to appropriate wiring 19 on the board 18. At this time this chip-printed circuit board assembly can again be tested and submitted to a so-called burn-in test, as is well known to the art. If one or more of the chips fail during this test it is an easy matter, for one skilled in the art to de-solder the failed chip and replace it.

Once the chip-printed circuit board assembly has been tested and pronounced good the lower end 17 of the printed circuit board 18, i.e., that portion of the printed circuit board having terminals 21 thereon is passed through the base 20 and hermetically sealed thereto.

The enclosure 11 is then placed over the rack and printed circuit and also hermetically sealed to the base 20. As is well known to the art, if addition cooling of the chips is desired, a suitable refrigerant or cooling fluid, such as a silicone or carbo-fluorine fluid, can be placed in the enclosure 11.

FIG. 6 depicts an alternate embodiment of the present invention. In this FIG. 6 there is illustrated an arrangement wherein a plurality of chips 12 have lead frame fingers 16 connected thereto. In this arrangement each of the lead frame members 16 are secured to the chip by a suitable insulating tape 29 and have their proximal ends 16A electrically connected to the elements in the active face of the chip and their distal ends 16D bent at right angles and bonded to suitable pads 30 on the adjoining surface of a printed circuit board or a multilayered ceramic (MLC) plate 31. Again, the stack of semiconductor chips 12 is supported, insulated and protected by an interposer structure or rack 14. It should be noted that, in this embodiment, the chips 12 are arranged within the rack 14 such that the lead frame fingers 16 pass out of the rack over the canterlevered edges of the shelves 14B. Thus, in this FIG. 6, the chips are inserted between the shelves 14B opposite to the direction of the insertion of the chips shown in FIG. 2. In this embodiment the back of the rack may be solid, i.e., it need not have apertures therein. The MLC plate 31 is affixed to a base 32 which has suitable terminals 33 extending there from. These terminals 33 are, in turn, connected to various terminals in the MLC plate (not shown) so that suitable signals may be passed to and from the chips 12 via the fingers 16. The enclosure 11 is also hermetically sealed to the base 32 to enclose the major portion of the multi-layer ceramic plate 31, the stack of semiconductor chips 12, the rack 14, and the lead frames fingers 16. Again suitable cooling fluids may be placed therein.

Figure 7:
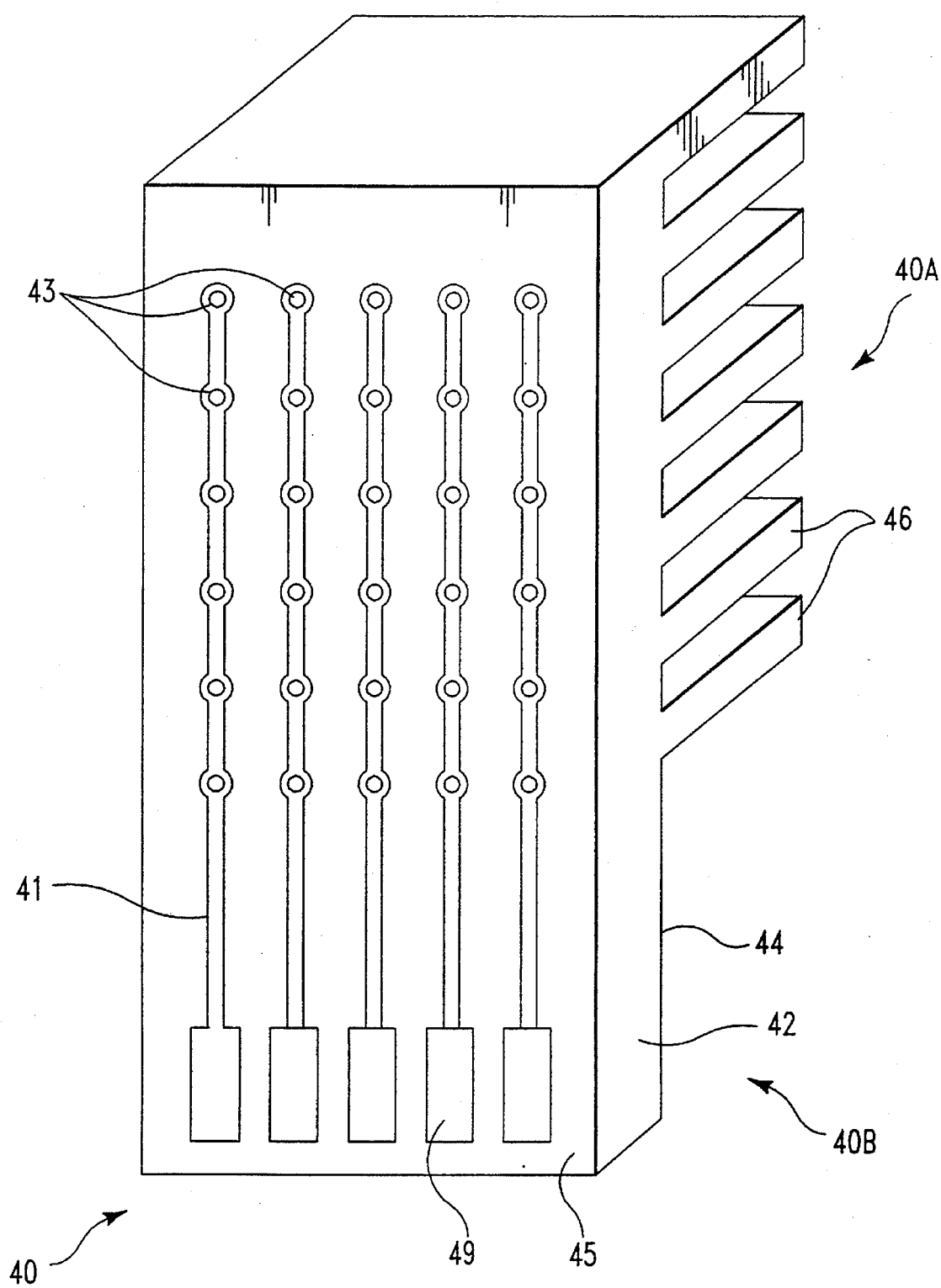
FIG. 7 is a isometric view of another embodiment of the rack.

FIG. 7 depicts a different embodiment of the rack of the invention. In this embodiment the rack 40 is again formed of an insulating or high dielectric material and has a planar back 42 with parallel major surfaces 44 and 45. The back 42 has a plurality of cantilevered, conterminate, closely spaced shelves 46 on one of its major surfaces 44 and has printed circuitry 41 formed on its other major surface 45 thus eliminating the need for a separate printed circuit board or MLC board. The wiring pattern or circuitry 43 is connected to terminals 49. A plurality of apertures 43 pass between the surfaces 44 and 45 and intercept the wiring 41 at suitable points. As shown, only the upper portion 40A of the rack 40, has on side 44 the shelves 46. Again the spacing of these shelves 46 is sufficient for a semiconductor chip having lead frame fingers affixed thereto to be inserted into the space between the shelves 46. The lower end 40B of the rack 40 having the terminals 49 thereon is adapted to pass through a suitable aperture in the base 43.

Once a semiconductor chip 12 is disposed between respective adjacent shelves 46, the lead frames bonded thereto are passed through the respective openings 43 in the back of the rack and electrically connected, e.g., by soldering, to the wiring patterns 41. This assembly can now be tested and submitted to a so-called burn-in test, as is well known to the art. If one or more of the chips fail during this test it is an easy matter to replace the failed chip. Once the assembly has been tested and pronounced good the lower portion 40B of the back of the rack 40 can be hermetically sealed to a suitable base and an enclosure can then be placed over the rack and hermetically sealed thereto as discussed above.

In the embodiments depicted herein each semiconductor chip is supported by a respective shelf on the rack. In each instance the space between the shelves is greater than the height of the semiconductor chip with the lead frame fingers bonded thereto, thus allowing convection currents to flow across the face of each chip while protecting each of the chips from undue mechanical shock.

It should also be noted that the chips in the stack may be identical to one another or may differ, that is, for example, one of the chips in the stack could be a logic chip and the others a memory chip. It should be further noted that although the drawings depict a ten chip stack a greater or lesser number is possible.

While the invention has been particularly described with respect to a preferred embodiment and several variations thereon, it should be understood that one skilled in the art can, from the foregoing, readily make further changes in form and detail without departing from the spirit and scope of the invention.

What is claimed is:

1. A package for semiconductor devices comprising:

a rack, consisting of a support having first and second major surfaces and having a plurality of parallel, juxtaposed, cantilevered plates on said first major surface;

said support having a plurality of wiring elements on said second major surface thereof;

a semiconductor chip having a fixed thickness between two of said plates;

the spacing between said two of said plates being greater than the thickness of the chip therebetween; and conductive means coupling said semiconductor chip to selected ones of said wiring elements.

2. The package of claim 1 wherein there is further provided a base upon which the rack is mounted and a enclosure encompassing the rack and hermetically sealed to the base.

3. The package of claim 2 wherein said rack has a lower extension passing through and hermetically sealed to the base, said wiring elements on said back extending across said lower extension and having terminals thereon.

4. A package for semiconductor devices comprising:

a base having first and second major surfaces and having an aperture therein;

a semiconductor chip supporting rack, having a back with first and second, parallel, major surfaces, mounted on said base, a major portion of said back of said rack extending from said first major surface of said base and a minor portion of the back of said rack extending through the aperture on the base and beyond said second major surface of said base;

the first major surface of the back of said rack being provided with a plurality of spaced, canterlevered, conterminate shelves, the second major surface of the back of said rack having a plurality of wiring elements on both said major and minor portions of said second major surface;

means for hermetically sealing said printed circuit board in said aperture in said base;

conductive means coupling a semiconductor chip supported between said conterminate shelves to selected ones of said wiring elements, disposed on said second major surface of said back of said rack;

said semiconductor chip having a fixed height;

the spacing between said shelves being greater than the height of the chip therebetween;

enclosure means hermetically sealed to said base and surrounding the major portion of said printed circuit board, said semiconductor chip and said sleeve thereon; and a cooling fluid in said enclosure.

5. A package for semiconductor devices comprising:

a base having first and second major surfaces;

a printed circuit board, having first and second, parallel, major surfaces affixed to said base;

said printed circuit board having a plurality of wiring elements on said major and minor portions of said major surfaces;

conductive means coupling a plurality of semiconductor chips, each having a fixed height, to selected ones of said wiring elements, disposed on said major portion of said printed circuit board;

an insulating rack having spaced shelves substantially surrounding and mechanically protecting and restricting the movement of a semiconductor chip therebetween; and the spacing between the shelves of said rack being greater than the height of the chip therebetween;

a cooling fluid in said enclosure.

6. The package of claim 5 wherein:

said base has an aperture therein; and said printed circuit board, passes through said aperture in said base, a major portion of said printed circuit board extending from said first major surface of said base and a minor portion of said printed circuit board extending beyond said second major surface of said base.

7. The package of claim 6 wherein:

a major portion of said printed circuit board extends from said first major surface of said base and a minor portion of said printed circuit board extends beyond said second major surface of said base.

8. The package of claim 7 wherein there is further provided:

means for hermetically sealing said printed circuit board in said aperture in said base; and enclosure means hermetically sealed to said base and surrounding the major portion of said printed circuit board, said semiconductor chip and said rack thereon.

9. The package of claim 8 wherein there is further provided a cooling fluid in said enclosure.

10. A package for semiconductor devices comprising:

an epoxy base having first and second major surfaces and having an a rectangular aperture therein;

a printed circuit board, having first and second parallel, major surfaces, passing through and hermetically sealed in said aperture, a major portion of said printed circuit board extending from said first major surface of said base and a minor portion of said printed circuit board extending beyond said second major surface of said base;

said printed circuit board having a plurality of wiring elements on said major and minor portions of said major surface;

lead frames fingers connecting respective semiconductor chips, having a known height, to selected ones of said wiring elements disposed on said major portion of said printed circuit board;

an insulating rack having a plurality of shelves, each of said shelves being interleaved between adjacent ones of said semiconductor chips and mechanically protecting and restricting the movement of said semiconductor chips therebetween:

the spacing between any adjacent shelves of said rack being greater than the height of the chip therebetween;

an aluminum enclosure hermetically sealed to said base and surrounding the major portion of said printed circuit board, said semiconductor chip and said sleeve thereon; and a cooling fluid within said enclosure.

* * * * *